(12) United States Patent
Matyac

(10) Patent No.: US 12,392,808 B2
(45) Date of Patent: Aug. 19, 2025

(54) SOCKET BASED DISCONNECT WITH SURGE PROTECTION

(71) Applicant: Mark Matyac, Lawrenceville, GA (US)

(72) Inventor: Mark Matyac, Lawrenceville, GA (US)

(73) Assignee: North American Power Products, Inc., Lawrenceville, GA (US)

( * ) Notice: Subject to any disclaimer, the term of this patent is extended or adjusted under 35 U.S.C. 154(b) by 697 days.

(21) Appl. No.: 17/640,527

(22) PCT Filed: Sep. 9, 2020

(86) PCT No.: PCT/US2020/049810
§ 371 (c)(1),
(2) Date: Mar. 4, 2022

(87) PCT Pub. No.: WO2021/050457
PCT Pub. Date: Mar. 18, 2021

(65) Prior Publication Data
US 2022/0334157 A1    Oct. 20, 2022

Related U.S. Application Data

(60) Provisional application No. 62/897,752, filed on Sep. 9, 2019.

(51) Int. Cl.
G01R 22/06  (2006.01)
G01R 1/04   (2006.01)
H01C 7/12   (2006.01)
H01H 71/10  (2006.01)
H02B 1/04   (2006.01)
H02H 9/04   (2006.01)

(52) U.S. Cl.
CPC ......... G01R 22/061 (2013.01); G01R 1/0416 (2013.01); H01C 7/12 (2013.01); H01H 71/1009 (2013.01); H02B 1/04 (2013.01); H02H 9/04 (2013.01)

(58) Field of Classification Search
CPC ...... G01R 22/061; G01R 1/0416; H01C 7/12; H01R 13/6277; H01R 13/63397
USPC ....................................................... 439/517
See application file for complete search history.

(56) References Cited

U.S. PATENT DOCUMENTS 10,380,869 B1 *  8/2019  Matyac ................. H02H 3/048
2006/0232433 A1 * 10/2006  Holle ................... G01R 22/066
                                                    340/667

\* cited by examiner

*Primary Examiner* — Thanh Tam T Le
(74) *Attorney, Agent, or Firm* — Bryan W. Bockhop; Bockhop Intellectual Property Law, LLC

(57) ABSTRACT

An intermediate disconnect section (100) for mounting on a meter base (10) and an electricity meter (20). A first source coupling (117) mounted on a platform (106) is electrically couplable to a source connector of the meter base (10). A second source coupling (119) is electrically coupled to a source connection of the electricity meter (120). A first load coupling (121) is electrically coupled to a load connector of the meter base (10). A second load coupling (123) electrically coupled to a load connection of the electricity meter (20) and to the first load coupling (121). A switch (110) couples and decouples the first source coupling (117) to and from the second source coupling (119). A switching mechanism (130) opens and closes the switch (110) and includes an external device (138) that allows a user to open and close the switch (110) manually.

17 Claims, 5 Drawing Sheets

SOCKET BASED DISCONNECT WITH SURGE PROTECTION

CROSS-REFERENCE TO RELATED APPLICATION(S)

This application claims the benefit of U.S. Provisional Patent Application Ser. No. 62/897,752, filed Sep. 9, 2019, the entirety of which is hereby incorporated herein by reference.

BACKGROUND OF THE INVENTION

1. Field of the Invention

The present invention relates to electric power systems and, more specifically, to a device that is coupled to an electric power meter.

2. Description of the Related Art

As shown in FIG. 1A, a typical existing meter base 10, used for electrically coupling power from a two phase power source (e.g., a first 120V AC "A-" phase and a second 120V AC "B-" phase that is out of phase with the first 120V AC phase) to a load (such as an electrical distribution system in a building) typically includes four sockets 14. A first socket 14 is coupled to the A-phase S120A wire from the source (which can be from the power grid or from an alternate source) and a second socket 14 is coupled to the B-phase S120B wire from the source. A neutral hub N is coupled to the neutral wire from the source (which, in some embodiments, is coupled to a ground). A third socket 14 is coupled to the A-phase L120A wire to the load and a fourth socket 14 is coupled to the B-phase L120B wire to the load. Typically, the wires to the load go through a knock-out hole 12 that is in communication with a hole in an exterior wall of a building. The wires from the source are contained in a conduit 19 coming from the source.

As shown in FIG. 1B, a typical existing electricity meter includes four plugs 16 that are complimentary in shape to the sockets 14 and that couple the above-described wires to an electricity meter, which measures consumption of electricity flowing from the source through the load. The meter includes an electrical measuring and display unit 18 (see FIG. 3A) for measuring electrical consumption, which is typically covered with a clear plastic protector 21.

With increased use of electronic devices there comes an increased risk of damage to such devices as a result of electrical surges (e.g., from lightning and power transients). To remedy this, some users plug all of their electronic devices into local surge suppressors. However, local surge suppressors can be bulky and seen as unsightly. Some users install surge suppressors into the breaker panels in their buildings. However, such installations can be time consuming, especially for multi-panel buildings such as office buildings and apartment complexes.

Also, powered electrical distribution systems can give rise to hazards during certain situations, such as when firefighters have to spray water into burning buildings—in which wires may be exposed—while fighting fires. In such emergency situations, finding a disconnect switch for an entire electrical distribution system can be difficult for emergency personnel.

Therefore, there is a need for a device that provides an easy installation of a surge suppressor and an electrical disconnect switch that is easy to find and operate.

SUMMARY OF THE INVENTION

The disadvantages of the prior art are overcome by the present invention which, in one aspect, is an intermediate disconnect section for mounting on a meter base having a source connector and a load connector. The intermediate section is adapted for mounting of an electricity meter having a source connection couplable to the source connector and a load connection couplable to the load connector. The intermediate section includes a platform. A first source coupling is mounted on the platform and is adapted to be electrically coupled to the source connector of the meter base. A second source coupling is mounted on the platform and is adapted to be electrically coupled to the source connection of the electricity meter. A first load coupling is mounted on the platform and is adapted to be electrically coupled to the load connector of the meter base. A second load coupling is mounted on the platform and is adapted to be electrically coupled to the load connection of the electricity meter and electrically coupled to the first load coupling. A switch is mounted on the platform and is adapted selectively to couple and decouple the first source coupling to and from the second source coupling. A switching mechanism is configured to open and close the switch. The switching mechanism includes a device that is external to the platform that allows a user to open and close the switch manually.

In another aspect, the invention is an intermediate section for mounting on a meter base having a source connector. The source connector includes a neutral coupling, and a load connector. The intermediate section is adapted for mounting of an electricity meter having a source connection couplable to the source connector and a load connection couplable to the load connector. The intermediate section includes a platform. A first source coupling is mounted on the platform and is adapted to be electrically coupled to the source connector of the meter base. A second source coupling is mounted on the platform and is adapted to be electrically coupled to the source connection of the electricity meter. A first load coupling is mounted on the platform and is adapted to be electrically coupled to the load connector of the meter base. A second load coupling is mounted on the platform and is adapted to be electrically coupled to the load connection of the electricity meter and electrically coupled to the first load coupling. A surge suppressor is mounted on the platform and is electrically coupled to a neutral coupling and to the first load coupling.

In yet another aspect, the invention is an electricity meter system that includes a meter base having a source connector electrically coupled to a power source and a load connector electrically coupled to a load and an electricity meter having a source connection couplable to the source connector and a load connection couplable to the load connector. An intermediate disconnect section includes: a platform; a first source coupling mounted on the platform and adapted to be electrically coupled to the source connector of the meter base; a second source coupling mounted on the platform and adapted to be electrically coupled to the source connection of the electricity meter; a first load coupling mounted on the platform and adapted to be electrically coupled to the load connector of the meter base; a second load coupling mounted on the platform and adapted to be electrically coupled to the load connection of the electricity meter and electrically coupled to the first load coupling; a switch mounted on the platform and adapted to couple and decouple the first source coupling to and from the second source coupling; and a switching mechanism that is configured to open and close the switch and that includes a device that is external to the platform that allows a user to open and close the switch manually.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
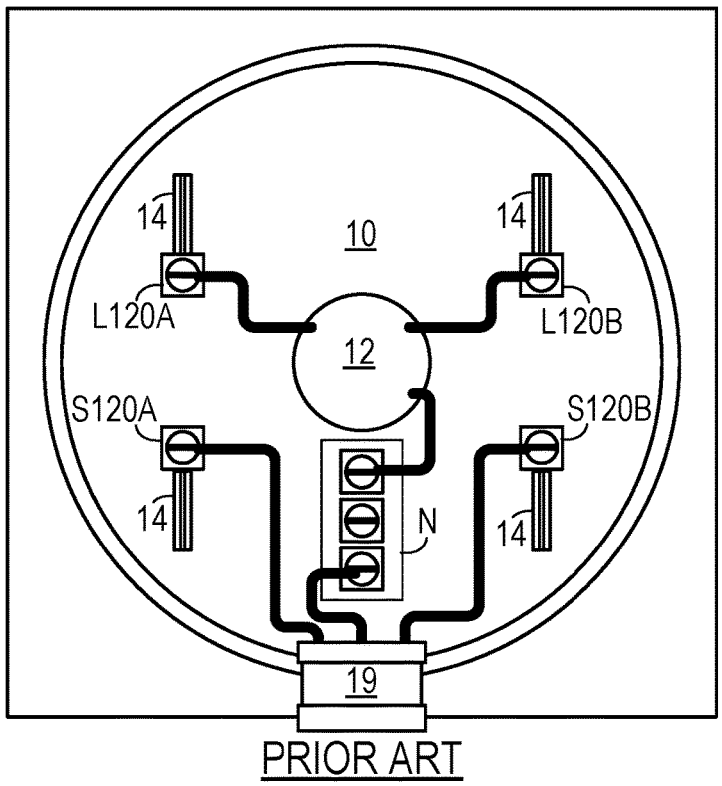
FIG. 1A is a schematic diagram of a prior art meter base wired to receive power from a power source and to provide power to a load.
Figure 1B:
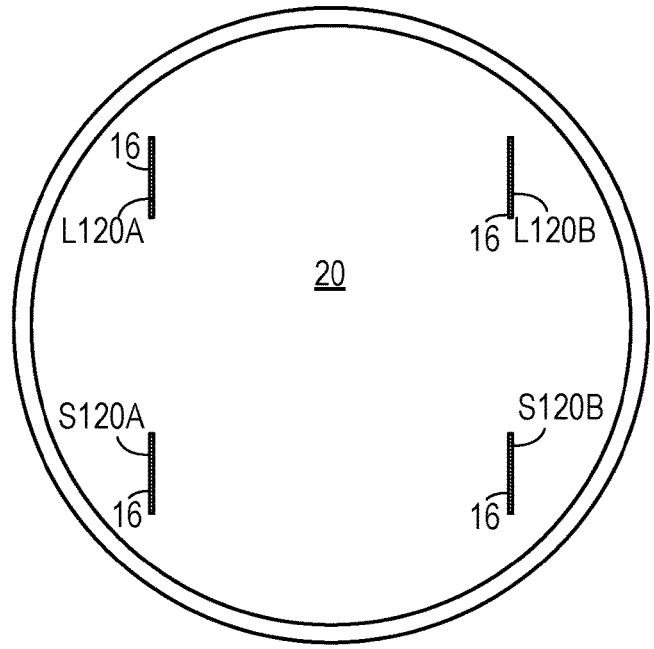
FIG. 1B is a schematic diagram of a bottom of a prior art electric meter of a type that is configured to be plugged into a meter base of the type shown in FIG. 1A.
Figure 2A:
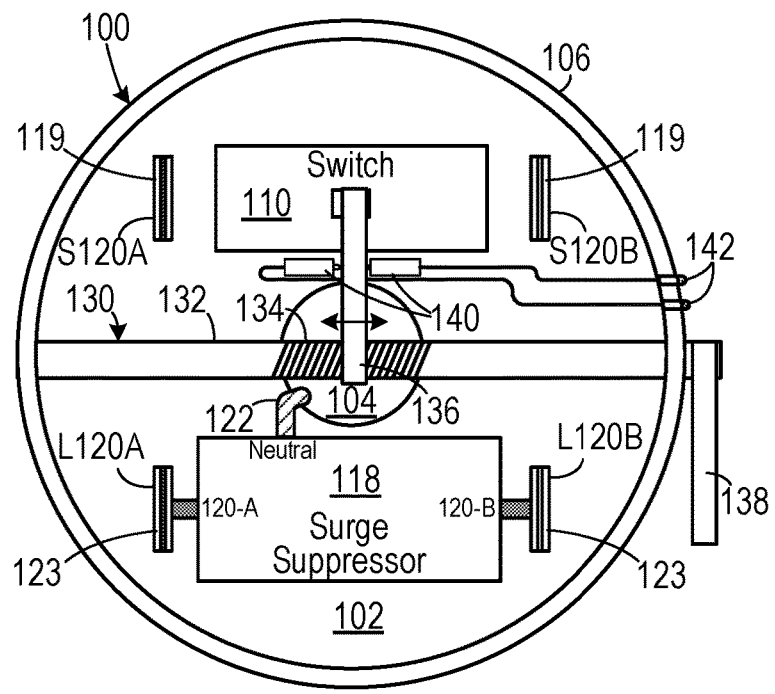
FIG. 2A is a schematic diagram of a top side plan view of one embodiment of an intermediate section that is configured to be coupled to electric meters, such as the type shown in FIG. 1B.
Figure 2B:
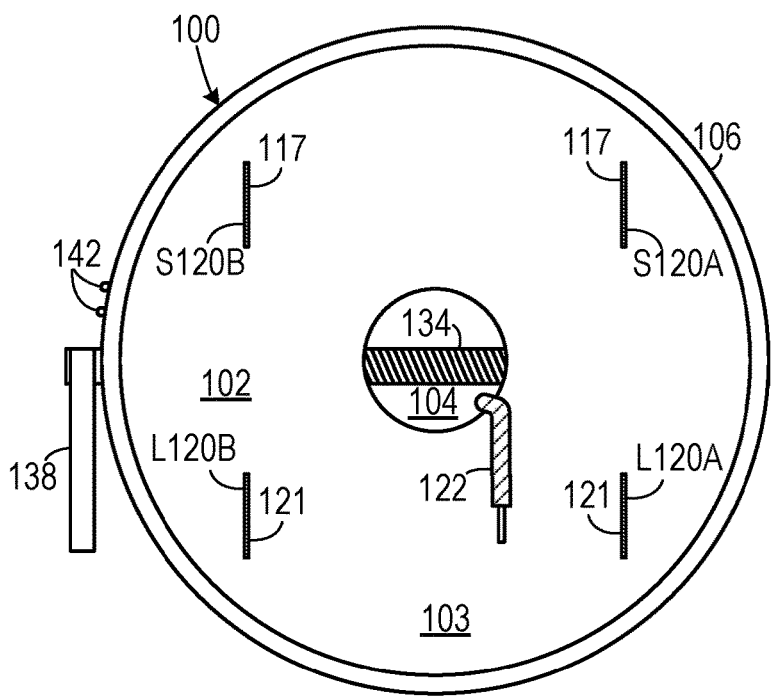
FIG. 2B is a schematic diagram of a bottom side plan view of the intermediate section shown in FIG. 2A that is configured to be plugged into a meter base of the type shown in FIG. 1A.
Figure 2C:
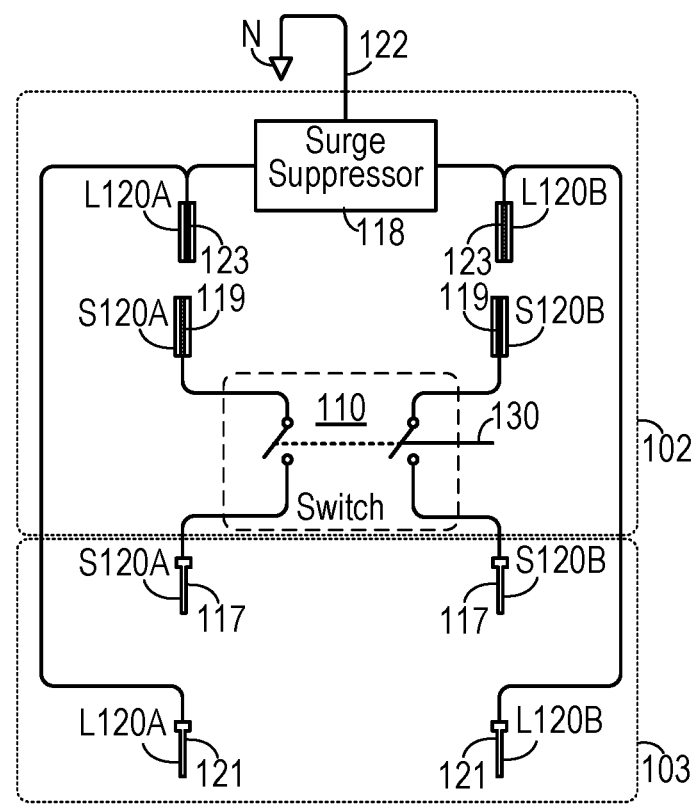
FIG. 2C is a wiring diagram of the intermediate section shown in FIGS. 2A and 2B.

A preferred embodiment of the invention is now described in detail. Referring to the drawings, like numbers indicate like parts throughout the views. Unless otherwise specifically indicated in the disclosure that follows, the drawings are not necessarily drawn to scale. The present disclosure should in no way be limited to the exemplary implementations and techniques illustrated in the drawings and described below. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIGS. 2A-2C and FIGS. 3A and 3B, one embodiment of a socket based disconnect with surge protection includes an intermediate section 100 for installation between a meter base 10 (which may be affixed to an exterior wall 2) and an electricity meter 20. The intermediate section includes a platform 106 that is shaped so as to fit both the meter base 10 and the electricity meter 20, and is typically made from a non-conductive material, such as a plastic. Electrically, the intermediate section 100 includes a bottom side 103 with load plugs 121 (L120A and L120B) that can be plugged into the load sockets 14 of the meter base 10 and source plugs 117 (S120A and S120B) that can be plugged into the source sockets 14 of the meter base 10 (see, FIGS. 3A-3B). The top side 102 includes load sockets 123 (electrically L120A and L120B) and source sockets 119 (electrically S120A and S120B) into which load plugs 16 and source plugs 16 of the electricity meter 20 can be plugged (see, FIGS. 3A-3B). The load sockets 123 (L120A and L120B) on the top side 102 are electrically coupled to the load plugs 121 (electrically L120A and L120B) on the bottom side 103.

In terms of the physical coupling components, a first source coupling 117, including two plugs—each corresponding to a different phase (A and B) from the power source, is mounted on the bottom side 103 of the platform 106. A second source coupling 119, including two sockets, is mounted on the top side 102 of the platform 106 and is selectively coupled to the source connection of the electricity meter 20. The first source coupling 117 is selectively couplable to the second source coupling 119 via the switch 110. A first load coupling 121 is mounted on the bottom side 103 of the platform 106 and is electrically couplable the load connectors of the meter base 10. A second load coupling 123 is mounted on the top side 102 of the platform 106 and is electrically couplable to the load connection of the electricity meter 120 and is electrically coupled to the first load coupling 121.

The intermediate section 100 includes a switch 110 that is configured to couple (and decouple) the source sockets S120A and S120B on the top side 102 to (and from) the source plugs S120A and S120B on the bottom side 103 selectively. A manual mechanism 130 that includes an external handle 138 is used to open and close the switch 110. Thus, the intermediate section 100 provides a way to disconnect the load from the source by flipping the handle 138. This can provide first responders (such as firefighters) and utility workers to disconnect the wiring system of a building (i.e., the load) from the grid power supply (i.e., the source) or other power source quickly from the outside of the building. (In alternate embodiments, the switch 110 can be configured to connect and disconnect load sockets L120A and L120B on the top side 102 to (and from) the load plugs L120A and L120B on the bottom side 103.)

A surge suppressor 118 (also referred to as a "surge protector") is coupled to the load plugs L120A and L120B and a neutral wire 122 that is to be coupled to the neutral N of both the source and the load through a hole 104. The surge suppressor 118 is configured to provide surge protection to both phases of the load, irrespective of whether the source power is coupled to the load. (In alternate embodiments, the surge suppressor 118 can be coupled to the source plugs S120A and S120B instead of to the load.) In one embodiment, the surge suppressor 118 can include at least one metal oxide varistor (MOV).

In one embedment, the switch control mechanism 130 includes a rod 132 with a threaded portion 134 that engages a complimentarily-threaded lateral movement member 136 that imposes lateral motion onto the switch 110 so as to open it or close it when the rod 132 is rotated. A handle 138 is affixed to the rod 132, which allows one to rotate the rod 132, thereby moving the movement member 136 so that when the handle 138 is in a first position, the switch 110 is open and the source is isolated from the load. When the handle 138 has been rotated to a second position that is different from the first position, the switch 110 is closed and current can flow through the meter 20 to the load.

Figure 3A:
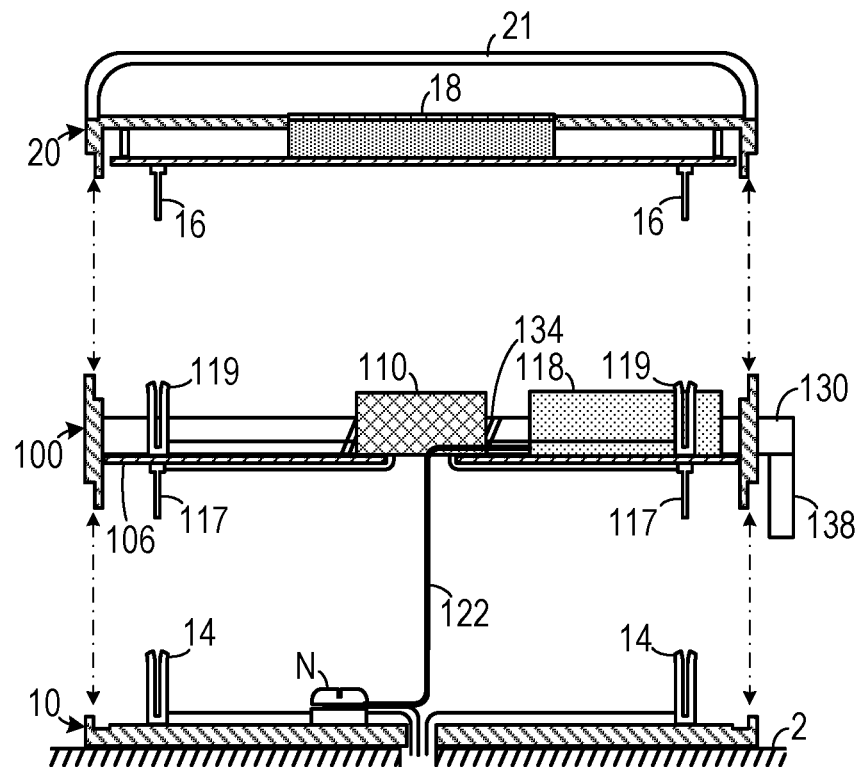
FIG. 3A is a side exploded view schematic diagram of a meter base, an intermediate section and an electric meter.
Figure 3B:
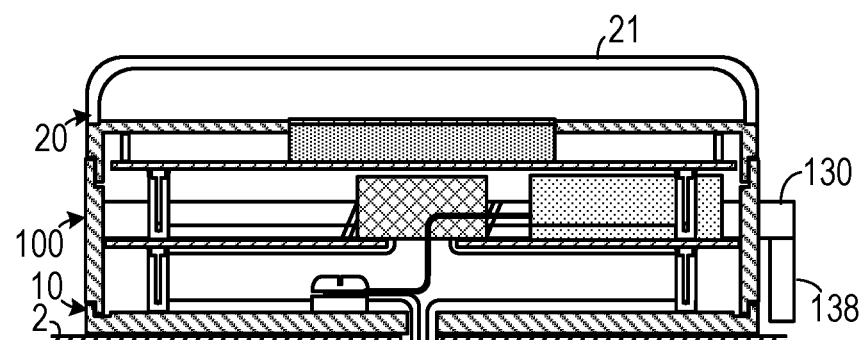
FIG. 3B is a side elevational view schematic diagram of the meter base, the intermediate section and the electric meter shown in FIG. 3A after installation.

As can be seen in FIG. 3A, prior to installing the intermediate section 100, the neutral wire 122 is coupled to the neutral N lead for the system at the hub on the meter base 10. Then, as shown in FIG. 3B, the intermediate section 100 is plugged into the meter base 10 and the meter 20 is plugged into the intermediate section 100. Retaining rings (not shown) can then be installed to prevent unplugging of the meter 20 and the intermediate section 100 so as to prevent tampering and hazards. The platform 106 can be made of plastic and has a shape that is complementary to both the meter base 10 and the electricity meter 20 so as to be able to fit tightly between the two.

The invention has the advantage of allowing both a power disconnect and a surge suppressor to be installed quickly, simply by unplugging a meter from a meter base, plugging in an intermediate section into the meter base and plugging the meter into the intermediate section. Also, it is easy for electricians and emergency personnel to find the disconnect, because it is at the location of the meter.

Figure 4:
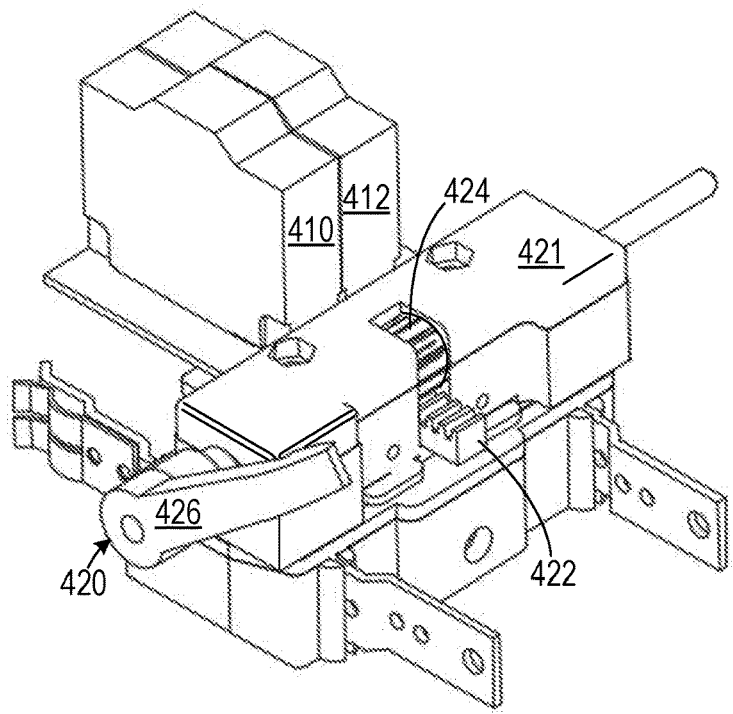
FIG. 4 is a perspective view of alternating disconnect system.
Figure 5A:
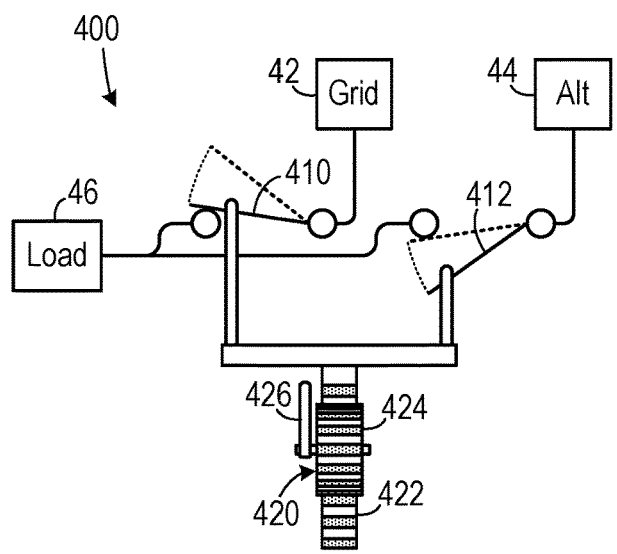
FIGS. 5A and 5B are schematic diagrams of the alternating disconnect system in different states.
Figure 5B:
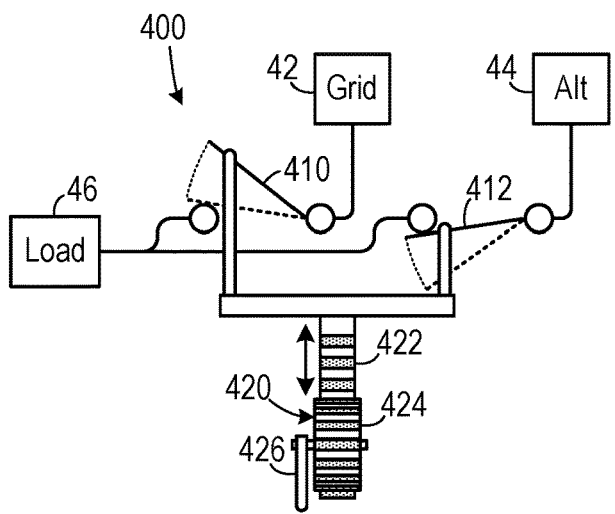

In one embodiment, as shown in FIGS. 4, 5A and 5B, the intermediate section can include an alternating disconnect system 400 that selectively couples the load 46 exclusively to only one of the main power source 42 (e.g., the power grid) or and alternate power source 44 (e.g., a solar or wind power source). The alternating disconnect system 400 includes a main power breaker 410 and an alternate power breaker 412, the states of both of which are controlled by a rack and pinion system 420. The rack and pinion system 420 includes a rack 422 that is mechanically coupled to the main power breaker 410 and the alternate power breaker 412. The rack 422 is enmeshed with a gear 424 that is coupled to a handle 426 that is supported by a frame 421. Rotation of the handle 426 causes the rack 422 to move forward and backward. The rack 422 is mechanically coupled to the main power breaker 410 and the alternate power breaker 412 in such a way that when the main power breaker 410 is open, the alternate power breaker 412 is closed and when the main power breaker 410 is closed, the alternate power breaker 412 is open. Thus, when the rack 422 is pushed forward by the gear 424, the main power source 42 is disconnected from the load 46 and the alternate power source 44 is connected to the load 46; when the rack 422 is pulled backward by the gear 424, the main power source 42 is connected to the load 46 and the alternate power source 44 is disconnected from the load 46. In one embodiment, both the main power breaker 410 and the alternate power breaker 412 have a central "neutral" position and the rack 422 can be positioned so that both are in the "neutral" position, thereby decoupling both the main power source 42 and alternate power source 44 from the load 46.

Although specific advantages have been enumerated above, various embodiments may include some, none, or all of the enumerated advantages. Other technical advantages may become readily apparent to one of ordinary skill in the art after review of the following figures and description. It is understood that, although exemplary embodiments are illustrated in the figures and described below, the principles of the present disclosure may be implemented using any number of techniques, whether currently known or not. Modifications, additions, or omissions may be made to the systems, apparatuses, and methods described herein without departing from the scope of the invention. The components of the systems and apparatuses may be integrated or separated. The operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. It is intended that the claims and claim elements recited below do not invoke 35 U.S.C. § 112(f) unless the words "means for" or "step for" are explicitly used in the particular claim. The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An intermediate disconnect section for mounting on a meter base having a source connector and a load connector, adapted for mounting of an electricity meter having a source connection couplable to the source connector and a load connection couplable to the load connector, comprising:
    (a) a platform;
    (b) a first source coupling mounted on the platform and adapted to be electrically coupled to the source connector of the meter base;
    (c) a second source coupling mounted on the platform and adapted to be electrically coupled to the source connection of the electricity meter;
    (d) a first load coupling mounted on the platform and adapted to be electrically coupled to the load connector of the meter base;
    (e) a second load coupling mounted on the platform and adapted to be electrically coupled to the load connection of the electricity meter and electrically coupled to the first load coupling;
    (f) a switch mounted on the platform and adapted selectively to couple and decouple the first source coupling to and from the second source coupling; and
    (g) a switching mechanism that is configured to open and close the switch and that includes a device that is external to the platform that allows a user to open and close the switch manually, wherein the switching mechanism comprises:
        (i) a rod including a threaded portion;
        (ii) a lateral movement member that includes a portion that is complimentarily-threaded to and engaged with the threaded portion of the rod, so that rotation of the rod causes lateral movement of the lateral movement member, the lateral movement member engaged with the switch and positioned so as to cause the switch to open when the lateral movement member is in a first position and to cause the switch to close when the lateral movement member is in a second position, different from the first position; and
        (iii) a handle affixed to the rod and positioned outside of the platform, the handle configured to apply rotational motion to the rod so as to cause the lateral movement of the lateral movement member, thereby selectively closing and opening the switch.

2. The intermediate disconnect section of claim 1, wherein the meter base source connector includes two sockets each coupled to a wiring system corresponding to a different phase of a power source, wherein the meter base load connector includes two sockets each coupled to a wiring system corresponding to a different phase of a load, wherein the electricity meter source connection includes two plugs, wherein the electricity meter load connection includes two plugs and wherein:
    (a) the first source coupling comprises two plugs;
    (b) the second source coupling comprises two sockets;

(c) the first load coupling comprises two plugs; and
(d) the second load coupling comprises two sockets.

3. The intermediate disconnect section of claim 1, further comprising a surge suppressor mounted on the platform and electrically coupled to a source neutral and to the first load coupling.

4. The intermediate disconnect section of claim 3, wherein the surge suppressor comprises a metal oxide varistor.

5. The intermediate disconnect section of claim 1, wherein the platform comprises a plastic material.

6. The intermediate disconnect section of claim 1, wherein the platform has a shape that is complimentary to both the meter base and to the electricity meter.

7. An intermediate section for mounting on a meter base having a source connector, the source connector including a neutral coupling, and a load connector, adapted for mounting of an electricity meter having a source connection couplable to the source connector and a load connection couplable to the load connector, comprising:
   (a) a platform;
   (b) a first source coupling mounted on the platform and adapted to be electrically coupled to the source connector of the meter base;
   (c) a second source coupling mounted on the platform and adapted to be electrically coupled to the source connection of the electricity meter;
   (d) a first load coupling mounted on the platform and adapted to be electrically coupled to the load connector of the meter base;
   (e) a second load coupling mounted on the platform and adapted to be electrically coupled to the load connection of the electricity meter and electrically coupled to the first load coupling;
   (f) a surge suppressor mounted on the platform and electrically coupled to a neutral coupling and to the first load coupling;
   (g) a switch mounted on the platform and adapted to couple and decouple the first source coupling to and from the second source coupling; and
   (h) a switching mechanism that is configured to open and close the switch and that includes a device that is external to the platform that allows a user to open and close the switch manually, the switching mechanism including:
      (i) a rod including a threaded portion;
      (ii) a lateral movement member that includes a portion that is complimentarily-threaded to and engaged with the threaded portion of the rod, so that rotation of the rod causes lateral movement of the lateral movement member, the lateral movement member engaged with the switch and positioned so as to cause the switch to open when the lateral movement member is in a first position and to cause the switch to close when the lateral movement member is in a second position, different from the first position; and
      (iii) a handle affixed to the rod and positioned outside of the platform, the handle configured to apply rotational motion to the rod so as to cause the lateral movement of the lateral movement member, thereby selectively closing and opening the switch.

8. The intermediate section of claim 7, wherein the surge suppressor comprises a metal oxide varistor.

9. The intermediate section of claim 7, wherein the meter base source connector includes two sockets each coupled to a wiring system corresponding to a different phase of a power source, wherein the meter base load connector includes two sockets each coupled to a wiring system corresponding to a different phase of a load, wherein the electricity meter source connection includes two plugs, wherein the electricity meter load connection includes two plugs and wherein:
   (a) the first source coupling comprises two plugs;
   (b) the second source coupling comprises two sockets;
   (c) the first load coupling comprises two plugs; and
   (d) the second load coupling comprises two sockets.

10. The intermediate section of claim 7, wherein the platform comprises a plastic material.

11. The intermediate section of claim 7, wherein the platform has a shape that is complimentary to both the meter base and to the electricity meter.

12. An electricity meter system, comprising:
   (a) a meter base having a source connector electrically coupled to a power source and a load connector electrically coupled to a load;
   (b) an electricity meter having a source connection couplable to the source connector and a load connection couplable to the load connector; and
   (c) an intermediate disconnect section including: a platform; a first source coupling mounted on the platform and adapted to be electrically coupled to the source connector of the meter base; a second source coupling mounted on the platform and adapted to be electrically coupled to the source connection of the electricity meter; a first load coupling mounted on the platform and adapted to be electrically coupled to the load connector of the meter base; a second load coupling mounted on the platform and adapted to be electrically coupled to the load connection of the electricity meter and electrically coupled to the first load coupling; a switch mounted on the platform and adapted to couple and decouple the first source coupling to and from the second source coupling; and a switching mechanism that is configured to open and close the switch and that includes a device that is external to the platform that allows a user to open and close the switch manually, wherein the switching mechanism comprises:
      (i) a rod including a threaded portion;
      (ii) a lateral movement member that includes a portion that is complimentarily-threaded to and engaged with the threaded portion of the rod, so that rotation of the rod causes lateral movement of the lateral movement member, the lateral movement member engaged with the switch and positioned so as to cause the switch to open when the lateral movement member is in a first position and to cause the switch to close when the lateral movement member is in a second position, different from the first position; and
      (iii) a handle affixed to the rod and positioned outside of the platform, the handle configured to apply rotational motion to the rod so as to cause the lateral movement of the lateral movement member, thereby selectively closing and opening the switch.

13. The electricity meter system of claim 12, wherein the meter base source connector includes two sockets each coupled to a wiring system corresponding to a different phase of a power source, wherein the meter base load connector includes two sockets each coupled to a wiring system corresponding to a different phase of a load, wherein the electricity meter source connection includes two plugs, wherein the electricity meter load connection includes two plugs and wherein:
   (a) the first source coupling comprises two plugs;
   (b) the second source coupling comprises two sockets;

(c) the first load coupling comprises two plugs; and (d) the second load coupling comprises two sockets.

14. The electricity meter system of claim 12, further comprising a surge suppressor mounted on the platform and electrically coupled to a source neutral and to the first load coupling.

15. The electricity meter system of claim 14, wherein the surge suppressor comprises a metal oxide varistor.

16. The electricity meter system of claim 12, wherein the platform comprises a plastic material.

17. The electricity meter system of claim 12, wherein the platform has a shape that is complimentary to both the meter base and to the electricity meter.

* * * * *